United States Patent
Kanagal Ramesh et al.

(10) Patent No.: US 11,876,539 B2
(45) Date of Patent: Jan. 16, 2024

(54) CURRENT TO DIGITAL CONVERTER CIRCUIT, OPTICAL FRONT END CIRCUIT, COMPUTED TOMOGRAPHY APPARATUS AND METHOD

(71) Applicant: ams International AG, Jona (CH)

(72) Inventors: Srinidhi Koushik Kanagal Ramesh, Eindhoven (NL); Thomas Fröhlich, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 221 days.

(21) Appl. No.: 17/637,186

(22) PCT Filed: Aug. 20, 2020

(86) PCT No.: PCT/EP2020/073333
§ 371 (c)(1),
(2) Date: Feb. 22, 2022

(87) PCT Pub. No.: WO2021/032837
PCT Pub. Date: Feb. 25, 2021

(65) Prior Publication Data
US 2022/0329256 A1    Oct. 13, 2022

(30) Foreign Application Priority Data
Aug. 22, 2019 (EP) .................... 19193046

(51) Int. Cl.
*H03M 3/00* (2006.01)
*H03F 3/45* (2006.01)
(Continued)

(52) U.S. Cl.
CPC ........ *H03M 3/412* (2013.01); *H03F 3/45475* (2013.01); *H03M 1/18* (2013.01); *H03M 1/66* (2013.01); *H03F 2200/18* (2013.01)

(58) Field of Classification Search
CPC .......... H03M 3/412; H03M 1/18; H03M 1/66; H03M 3/414; H03M 3/454; H03M 3/42;
(Continued)

(56) References Cited

U.S. PATENT DOCUMENTS 4,342,983 A  *  8/1982  Weigand ................. H03M 1/10
                                                         374/103
5,754,131 A     5/1998  Ribner et al.
(Continued)

FOREIGN PATENT DOCUMENTS

EP          2429081 A1     3/2012

OTHER PUBLICATIONS

International Search Report and Written Opinion in corresponding International Application No. PCT/EP2020/073333, dated Jan. 18, 2021, 16 pages.
Pavan, S., "Power Reduction in Continuous-Time Delta-Sigma Modulators Using the Assisted Opamp Technique", IEEE Journal of Solidstate Circuits, vol. 45, No. 7, Jul. 2010, pp. 1365-1379.

*Primary Examiner* — Jean B Jeanglaude
(74) *Attorney, Agent, or Firm* — MH2 TECHNOLOGY LAW GROUP LLP

(57) ABSTRACT

A current to digital converter circuit has an integrator amplifier with an input adapted to receive a current signal and an output adapted to provide a voltage signal as a function of an integration of the current signal, a quantizer circuit with an input which is coupled to the output of the integrator amplifier and with an output adapted to provide a binary result signal as a function of a comparison of the voltage signal with at least a first reference voltage signal, a digital-to-analog converter circuit which is coupled in a switchable manner as a function of the binary result signal to the input of the integrator amplifier, and a controlled current source which is coupled to the output of the integrator amplifier via a first switch which is controlled as a
(Continued)

function of the binary result signal such that an auxiliary current is supplied to the output of the integrator amplifier.

15 Claims, 8 Drawing Sheets

(51) Int. Cl.
*H03M 1/18* (2006.01)
*H03M 1/66* (2006.01)

(58) Field of Classification Search
CPC ............. H03F 3/45475; H03F 2200/18; H03F 2203/45512; H03F 3/08
See application file for complete search history.

(56) References Cited

U.S. PATENT DOCUMENTS

| | | | |
|---|---|---|---|
| 9,178,528 B1* | 11/2015 | Waltari | H03M 1/66 |
| 9,362,936 B1* | 6/2016 | Caffee | H03K 5/135 |
| 10,581,453 B1* | 3/2020 | Ganta | H03M 3/464 |
| 2008/0062022 A1 | 3/2008 | Melanson | |
| 2009/0021409 A1 | 1/2009 | Mathe et al. | |
| 2015/0180501 A1* | 6/2015 | Courcy | H03M 1/66 |
| | | | 341/144 |
| 2015/0271585 A1 | 9/2015 | Straeussnigg et al. | |
| 2016/0373120 A1* | 12/2016 | Caffee | H03L 7/183 |

* cited by examiner

CURRENT TO DIGITAL CONVERTER CIRCUIT, OPTICAL FRONT END CIRCUIT, COMPUTED TOMOGRAPHY APPARATUS AND METHOD

CROSS-REFERENCE TO RELATED APPLICATIONS

The present application is the national stage entry of International Patent Application No. PCT/EP2020/073333, filed on Aug. 20, 2020, and published as WO 2021/032837 A1 on Feb. 25, 2021, which claims the benefit of priority of European Patent Application No. 19193046.0, filed on Aug. 22, 2019, all of which are incorporated by reference herein in their entirety.

FIELD OF THE INVENTION

The present disclosure relates to the field of amplifiers, especially amplifiers forming part of current to digital converters, in optical front ends. Specifically, the application is directed to a current to digital converter circuit, an optical front end circuit, a computed tomography apparatus and a method for providing an output voltage.

BACKGROUND OF THE INVENTION

The need for low noise and low power amplifiers is desirable in many areas. While there are many techniques to address flicker noise, like chopping, auto zeroing etc., there are not many techniques addressing thermal noise since it is considered fundamental to the amplifier. The tradeoff between thermal noise of a system, in this case an amplifier, and its speed is considered fundamental and a known way to improve is by sacrificing power and/or area. Since this tradeoff happens to be so fundamental, most techniques revolve around increasing the signal power in order to achieve a better signal-to-noise ratio, SNR.

This is also true of optical front ends which detect optical energy by means of an optical sensor, e.g. a photodiode, and convert said energy into a voltage signal. The first amplifier in optical front ends, i.e. the amplifier receiving a current signal from the photodiode, is also known as front end amplifier. Said amplifier typically dictates the noise performance of the optical front end and the super-ordinate system which employs the optical front end. Such super-ordinate system may be a computed tomography, CT, apparatus. Known optical front end amplifiers in CT applications in the past have solved the problem of noise by either burning more power or by using a stacked differential pair approach in implementing the front end amplifier. However, it has turned out that for this approach expensive low threshold voltage transistors are needed.

An object can therefore be seen in providing a current to digital converter circuit, an optical front end circuit, a computed tomography apparatus and a method for providing an output voltage with an improved noise-power tradeoff.

The object is achieved by the subject-matter of the independent claims. Embodiments and developments are defined in the dependent claims.

SUMMARY OF THE INVENTION

In one embodiment a current to digital converter circuit has an integrator amplifier, a quantizer circuit, a digital-to-analog converter circuit and a controlled current source. The integrator amplifier has an input which is adapted to receive a current signal and an output which is adapted to provide a voltage signal as a function of an integration of the current signal. The quantizer circuit has an input which is coupled to the output of the integrator amplifier and an output which is adapted to provide a binary result signal as a function of a comparison of the voltage signal with at least a first reference voltage signal. The digital-to-analog converter circuit is coupled in a switchable manner to the input of the integrator amplifier. The switchable manner is realized in function of the binary result signal. The controlled current source is coupled to the output of the integrator amplifier via a first switch which is controlled in function of the binary result signal such that an auxiliary current is supplied to the output of the integrator amplifier.

The integrator amplifier integrates the current signal at its input and therefrom provides the voltage signal. Within the quantizer circuit said voltage signal is compared to the first reference voltage signal and the binary result signal is provided therefrom. As soon as a level of the binary result signal changes, for example from 1 to 0 or from 0 to 1, the digital-to-analog converter circuit is triggered in order to inject charge to the input of the integrator amplifier so as to keep the voltage signal at the output of the integrator amplifier in a valid range. At the same time, i.e. triggered by the level change of the binary result signal, the controlled current source supplies the auxiliary current to the output of the integrator amplifier. Thereby, charge related to the level change or pulse of the binary result signal is provided to the output of the integrator amplifier. Therein the binary result signal comprises a digital, especially binary representation of the current signal.

In the proposed current to digital converter circuit most of the output charge of the integrator amplifier is supplied by the controlled current source at the very moment at which this charge is needed, i.e. the level change of the binary result signal. By this the integrator amplifier is enabled to settle out pulses of the binary result signal at a very high accuracy, thereby meeting linearity constraints and reducing power consumption.

In an exemplary implementation the output of the quantizer circuit changes its level from 0 to 1 as soon as the voltage signal at the output of the integrator amplifier goes below the first reference voltage signal. Triggered by this impulse of the binary result signal, charge is injected in the opposite direction with respect to the current signal at the input of the integrator amplifier, the amount of charge representing the previously integrated charge supplied with the current signal before the level change of the binary result signal. Concurrently, the controlled current source is activated for supplying the auxiliary current to the output of the integrator amplifier, thereby helping in recharging the output of the integrator amplifier more rapidly. Thus the settling situation at the output of the integrator amplifier is greatly improved, for instance by the factor of 4 to 20.

In a development the auxiliary current is supplied upon occurrence of an impulse of the binary result signal for an amount of time which is smaller than a time constant realized by the integrator amplifier.

The time constant realized by the integrator amplifier is the time constant of the operational amplifier used for implementing the integrator amplifier. The amount of time during which the auxiliary current is supplied is smaller, for instance by a factor of 10, than the time constant of the integrator amplifier. Thereby, the integrator amplifier does not interfere with the auxiliary circuit which makes for fast and largely ringing-free settling. The design is such that most of the charge needed at the output of the integrator amplifier is provided by means of the auxiliary current, whereas the residual charge is provided by the integrator amplifier itself.

In a development the controlled current source comprises a current generation unit and a timing generation unit. The timing generation unit is prepared to provide a charging clock signal, wherein a rising edge of the charging clock signal is generated upon occurrence of a rising edge of the binary result signal and a falling edge of the charging clock signal is generated as soon as charging of an auxiliary capacitor comprised by the timing generation unit has reached a level of a second reference voltage. Charging the auxiliary capacitor is effected by means of a bias current. The current generation unit is prepared to provide the auxiliary current. For this it comprises either a current mirror component for mirroring the bias current or an adjustable resistor which is connected to a supply potential.

Upon occurrence of a level change of the binary result signal, for example, upon occurrence of a rising edge of the binary result signal conforming to a level change from 0 to 1 of the binary result signal, a first level change of the charging clock signal is generated. Upon occurrence of the first level change of the charging clock signal, for instance a change from 0 to 1 or a rising edge of the charging clock signal, the auxiliary capacitor is charged by the bias current. As soon as a voltage drop across the auxiliary capacitor, which is a function of the charging of said capacitor, reaches the level of the second reference voltage, the second level change of the charging clock signal, for example a level change from 0 to 1 or a falling edge, is generated. Concurrently charging of the auxiliary capacitor is stopped.

The current generation unit either has the current mirror component which mirrors the bias current in order to provide the auxiliary current or, alternatively, the current generation unit has the adjustable resistor which is connected to the supply potential with one terminal and provides the auxiliary current. In any of these alternatives, the auxiliary current is provided to the output of the integrator amplifier whenever the first switch is closed. As described above, the first switch is controlled as a function of the binary result signal. Said function may be a slight delay in time to realize non-overlapping. The charging clock signal which is a function of the binary result signal in that the first level change of the charging clock signal is generated upon occurrence of a level change of the binary result signal. In this way, the charging clock signal is synchronized with the binary result signal. The charging clock signal is used to control the first switch. For example, the first switch is closed on occurrence of the first level change of the charging clock signal which basically coincides with the level change of the binary result signal. The first switch may be opened as soon as the second level change of the charging clock signal appears.

In a further development the current to digital converter circuit comprises a control unit which is prepared to provide a main clock signal for controlling operation of at least the quantizer circuit. By this, provision of the binary result signal is basically synchronized with the main clock signal. As a consequence, the charging clock signal is also synchronized with or clocked to the main clock signal.

In a development the integrator amplifier comprises an operational amplifier and an integration capacitor which is coupled in a feedback loop of the operational amplifier between its output and its inverting input. The operational amplifier is realized by a folded cascode in which each folding node is implemented by a transistor.

In a conventional folding cascode structure, the cascodes of the differential input pair transistors are biased by a current source. This conventional folding structure therefore only settles as fast as determined by the bias current which is a constant current. The folded cascode as described above realizes the folding node by a transistor. Consequently, the signal current with the same polarity from the other leg is used for biasing the cascode. This achieves fast settling of the output and allows for a low voltage operation.

In another development, the operational amplifier of the integrator amplifier is realized by two or more stages.

Therein the two or more stages are realized each by an operational amplifier which is configured as an inverting amplifier. In each of said stages the folded cascode as described above may be used in an implementation. An output of the first of said stages, i.e. the operational amplifier which directly receives the current signal represents the output of the integrator amplifier.

In a development the digital-to-analog converter circuit is realized as a one-bit digital-to-analog converter on the basis of a switched capacitor. Said switched capacitor is additionally connected in a switchable manner to respective terminals for supplying a third reference voltage. The switching of the switched capacitor therein is controlled as a function of the binary result signal.

During the integration of the current signal in the integrator amplifier the switched capacitor is charged to the level of the third reference voltage. As soon as the voltage signal reaches the level of the first reference voltage signal, the level of the binary result signal toggles and the switched capacitor is connected to the input of the integrator amplifier. Thus, an amount of charge corresponding to the previously integrated current signal is additionally provided to the input of the integrator circuit.

In an exemplary implementation, the second reference voltage is chosen to be proportional or equal to the third reference voltage.

In an alternative embodiment the digital-to-analog converter circuit is realized as an M bit digital-to-analog converter on the basis of multiple capacitors. Therein M is an integer greater than or equal to 2.

In a development the quantizer circuit is realized as a clocked comparator amplifier for exactly one bit. The clocked comparator amplifier has a clock input which is supplied with the main clock signal. The result of comparing the voltage signal with the first reference voltage signal is provided at the output of a quantizer circuit for every impulse of the main clock signal in the form of the binary result signal.

In an alternative embodiment the quantizer circuit is realized as a clocked quantizer for M bit. This realization is used in combination with the M bit digital-to-analog converter as described above.

In one embodiment an optical front end circuit comprises the current to digital converter circuit as described above, wherein the current signal at the input of the integrator amplifier comprises a photocurrent of a photodiode which can be connected to said input. The optical front end circuit further comprises a sampling capacitor, an analog-to-digital, ADC, circuit and a calculation circuit. The sampling capacitor is coupled to the output of the integrator amplifier via a second switch. Said second switch is controlled by a sampling clock signal. The ADC circuit is coupled by its input to the sampling capacitor via a third switch, the third switch being controlled by a conversion clock signal. The ADC circuit has an output at which a digital signal is provided. The digital signal is a function of the current signal and comprises N bit, wherein N is an integer greater than or equal to 1. The calculation unit is coupled to the output of the ADC circuit and to an output of the quantizer circuit. The calculation circuit is prepared to provide a digital word signal by combining the binary result signal with the digital signal.

The optical front end circuit realizes an optical signal, i.e. optical energy received by the photodiode, to digital conversion. For this the photocurrent supplied by the photodiode is provided to the input of the current to digital converter circuit. The integrator amplifier together with the quantizer circuit therefrom provide a coarse digital value having one or more bits in the form of the binary result signal. The voltage signal at the output of the integrator amplifier is sampled on the sampling capacitor under control of the sampling clock signal. The charge stored on the sampling capacitor is converted into the digital signal by the ADC circuit under control of the conversion clock signal. The calculation circuit combines the digital value provided with the binary result signal with the digital value provided with the digital signal and therefrom delivers the digital word signal.

By means of the current to digital converter circuit which is used in the optical front end circuit, good noise performance can be achieved with much less power and without increased process options compared to the state of the art realizations.

The optical front end circuit as described above consequently consists of a coarse analog-to-digital conversion realized within the current to digital converter circuit and a fine analog-to-digital conversion which is performed after the coarse conversion. Each time the coarse conversion is completed, i.e. as soon as the binary result signal provides one or M bits, the controlled current source of the current to digital converter circuit is coupled to the output of the integrator amplifier in order to recharge this output more rapidly. The ADC circuit which realizes the fine analog-to-digital conversion of the current signal providing the lesser significant bits of the digital word signal may be realized as a sigma-delta or successive approximation ADC. The current to digital converter circuit may be employed also for realizing the ADC circuit.

In a development the control unit is prepared to provide the sampling clock signal and the conversion clock signal both in dependence on the main clock signal. Therein, the conversion clock signal and the sampling clock signal have different clock rates or basically equal clock rates.

In a case in which the conversion clock signal differs from the sampling clock signal, the ADC circuit realizing the fine ADC conversion runs at a different clock rate from the rate at which the voltage signal is sampled onto the sampling capacitor. Therein the sampling clock signal rate may be a fraction of the main clock signal rate, whereas the conversion clock signal rate may be a multiple of the main clock signal rate.

In another development a calculation circuit is prepared to provide the digital word as a correlated double sample.

For this, the calculation circuit stores a digital value combined from coarse and fine analog-to-digital conversions with respect to the conversion of a reset level of the current signal and a subsequently determined digital value corresponding to the conversion of a signal current level of the current signal and provides both values with the digital word signal.

In the optical front end circuit a calibration is used to scale up the bits of the coarse ADC, i.e. the current to digital converter circuit, so as to form the final data word provided with the digital word signal. The digital word signal is provided as a combination of the bits provided with the binary result signal multiplied by a factor and the bits of the digital signal. In the calibration said factor is adjusted. For calibrating said factor, two known values of current are provided to the optical front end circuit in an exemplary way. The values provided upon conversion of said two current values with the binary result signal and the digital signal are used to determine the factor.

By keeping the sampling clock rate independent of the conversion clock rate multiplexing several coarse ADCs to one Fine ADC is enabled. By employing the main clock signal with a higher rate than the sampling clock signal the noise requirements of the Fine ADC can be relaxed.

In one embodiment a computed tomography apparatus has an optical front end according to one of the embodiments described above.

Consequently, the optical front end circuit as described above is prepared for use in the computed tomography apparatus.

In one embodiment a method for providing an output voltage comprises at least the following steps:
  supplying a current signal,
  converting the current signal into an output voltage by means of charge integration in an integrator amplifier,
  quantizing the output voltage and therefrom providing a binary result signal having at least one bit,
  upon provision of the binary result signal basically concurrently providing an auxiliary current to an output of the integrator amplifier for recharging said output and adding an additional amount of charge in function of the binary result signal to the current signal.

Due to the recharging of the output of the integrator amplifier by means of the auxiliary current, a settling time of the integrator amplifier is greatly reduced. As the auxiliary current is supplied for a defined amount of time, which is a quarter or smaller than the time constant realized within the integrator amplifier, the auxiliary current does not interfere with the integrator amplifier. This is especially advantageous in the case that the integrator amplifier is realized by two or more stages which would give rise to a settling behavior of higher order. As the auxiliary current is only supplied for a short amount of time according to the proposed concept, settling behavior is improved.

The method may be implemented by the current to digital converter circuit defined above.

The text below explains the invention in detail using exemplary embodiments with reference to the drawings. Components and circuit elements that are functionally identical or have the identical effect bear identical reference numbers. In so far as circuit parts or components correspond to one additional in function, a description of them will not be repeated in each of the following figures.

DETAILED DESCRIPTION

Figure 1:
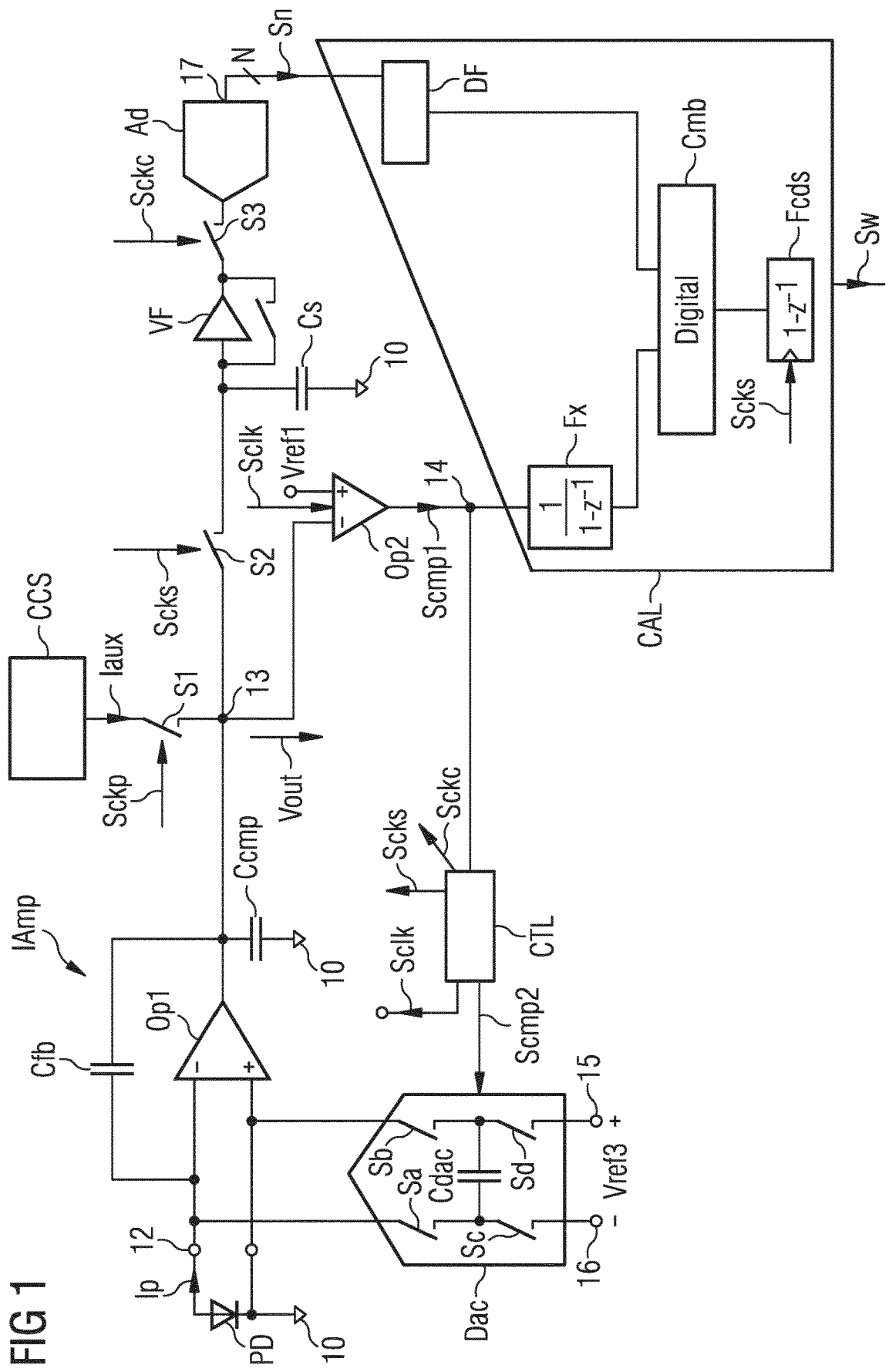
FIG. 1 shows an embodiment example of an optical front end circuit with a current to digital converter circuit.

FIG. 1 shows an embodiment example of an optical front end circuit with a current to digital converter circuit, both according to the proposed principle. The current to digital converter circuit comprises an integrator amplifier IAmp, a quantizer circuit Opt, a digital-to-analog converter circuit Dac and a controlled current source CCS. The integrator amplifier IAmp has an operational amplifier Op1 and an integration capacitor Cfb which is coupled in a feedback loop of the operational amplifier Op1 between its output 13 and its inverting input 12. The input 12 is adapted to receive a current signal Ip.

The quantizer circuit Op2 is connected to output 13 such that it receives the voltage signal Vout as an input. In the depicted example, the quantizer circuit Op2 is realized as a clocked comparator which receives the voltage signal Vout on its non-inverting input, a first reference voltage signal Vref1 on its inverting input and a main clock signal Sclk on its clock input. The quantizer circuit Opt provides a binary result signal Scmp1 at its output 14 in dependence on a comparison of the voltage signal Vout with at least the first reference voltage signal Vref1.

The digital-to-analog converter circuit Dac is connected in a switchable manner, i.e. by a number of switches to the input 12 of the integrator amplifier IAmp. In the depicted example the digital-to-analog converter circuit Dac comprises a switched capacitor Cdac which can be connected either in series to the input 12 of the integrator amplifier IAmp or to terminals 15 and 16. Between terminals 15 and 16 a third reference voltage Vref3 is supplied. The switches of the digital-to-analog converter circuit Dac are controlled by a Dac step signal Scmp2 which is a function of the binary result signal Scmp1.

The level of the third reference voltage Vref3 is chosen such that together with the switched capacitor Cdac of the digital-to-analog converter Dac, the charge provided is equal and opposite to the full scale input current signal Ip.

The auxiliary current source CCS is connected to the output 13 of the integrator amplifier IAmp by means of a first switch S1. The controlled current source CCS is prepared to provide an auxiliary current Iaux to the output 13 whenever the first switch S1 is closed. The first switch S1 is controlled depending on the binary result signal Scmp1.

The current to digital converter circuit in the depicted example also comprises an output capacitor Ccmp which is connected to the output 13 of the integrator amplifier IAmp. The output capacitor Ccmp is also connected to a reference potential terminal 10. In the depicted example the current to digital converter circuit further comprises a control unit CTL which is connected to the output 14 of the quantizer circuit Op2. The control unit CTL is prepared to provide the main clock signal Sclk which controls operation of the quantizer circuit Op2. Furthermore, the control unit CTL receives the binary result signal Scmp1 and therefrom provides a Dac step signal Stmp2 which controls operation of the switches of a digital-to-analog converter circuit Dac. The control unit CTL provides the Dac step signal depending on the binary result signal Scmp1 by inserting a short delay to realize a non-overlap between the Dac step signal Scmp2 and the binary result signal Scmp1.

In the depicted example a photodiode PD is connected to the input 12 of the integrator amplifier IAmp. In detail, an anode terminal of the photodiode PD is connected to the input 12, while a cathode terminal of the photodiode PD is connected to the reference potential terminal 10 which is connected to the non-inverting input of the integrator amplifier IAmp at the same time.

The current signal Ip is supplied to the inverting input 12 of the integrator amplifier IAmp. The current signal Ip is integrated by the integrator amplifier IAmp and therefrom the voltage signal Vout is provided at the output 13. The quantizer circuit Opt compares the voltage signal Vout to a first reference voltage signal Vref1 and therefrom provides the binary result signal Scmp1. Pulses of the binary result signal Scmp1 are generated also depending on the main clock signal Sclk. The control unit CTL generates the Dac step signal Scmp2 depending on the binary result signal Scmp1 by possibly adding some delay in order to realize a non-overlap between the two signals. The Dac step signal Scmp2 controls switches Sa, Sb, Sc and Sd of the digital-to-analog converter circuit Dac. The switch capacitor Cdac is charged to the level of the second reference voltage when switches Sc and Sd are closed. As soon as the output 14 of the quantizer circuit Opt toggles, switches Sc and Sd are opened and after a small non-overlap time which is not shown in the diagram for simplicity, switches Sa and Sb are closed such that the charge accumulated on the switched capacitor Cdac is provided to the input 12 of the integrator amplifier IAmp. Concurrently, i.e. when the switches Sa and Sb are closed after the output Scmp1 of the quantizer circuit Opt toggles, the first switch S1 is closed by means of the charging clock signal Sckp. The controlled current source CCS consequently provides the auxiliary current Iaux for an amount of time which is controlled by the charging clock signal Sckp. Said amount of time is smaller than a time constant Tau resulting from the integrator amplifier IAmp.

As a further variation the DAC may consist of 2 Cdac units which operate in an alternating fashion to allow 100% duty cycle. Other schemes which use the second DAC only in case the first DAC is recharging are also possible.

The proposed current to digital converter circuit enables faster settling of the output 13 of the integrator amplifier IAmp which improves the settling time by a factor of, for example, 4 to 20. The optical front end circuit comprises the described current to digital converter circuit and a sampling capacitor Cs, an analog-to-digital converter, ADC, circuit Ad, a second switch S2, a third switch S3 and a calculation circuit Cal. A photodiode PD can be connected to the input 12 of the integrator amplifier IAmp. The current signal Ip consequently comprises a photocurrent of the photodiode PD. The sampling capacitor Cs is coupled to the output 13 of the integrator amplifier IAmp by means of the second switch S2 which is controlled by a sampling clock signal Scks which is provided by the control unit CTL. The ADC is coupled by its input to the sampling capacitor Cs by means of the third switch S3 which is controlled by a conversion clock signal Sckc which is also provided by the control unit CTL. The output 17 of the ADC circuit Ad and the output 14 of the quantizer circuit Opt are each coupled to the calculation circuit CAL. At the output 17 of the ADC circuit Ad a digital signal Sn is provided which is a function of the current signal Ip and comprises N bits, wherein N is an integer greater than or equal to one.

The calculation circuit CAL provides a digital word signal Sw by combining the binary result signal Scmp1 with the digital signal Sn. For this the calculation circuit CAL may have a decimation filter DF. This decimation filter is applied to the digital signal Sn and may be advantageous in case of oversampling of the ADC circuit Ad. The calculation circuit CAL may further have a digital function Fx which is applied to the binary result signal Scmp1. Fx here shows the integrator function which amounts to counting the output of the quantizer circuit Opt. Together with the correlated double sampling operation, a value provided with the digital word signal Sw corresponds to the total charge injected at the input 12 of the integrator amplifier IAmp between the current and previous clock edges of the sampling clock signal Scks.

A combination of the bits provided with the binary result signal Scmp1 and the N bits provided with the digital signal Sn is effected in the combiner component Cmb. The calculation circuit CAL may further have a correlated double sampling, CDS, logic circuit Fcds which provides for correlated double sampling. Correlated double sampling refers to taking first order difference of the digital word at any given rising edge of the sampling clock signal Scks and the digital word at the immediately preceding rising edge of the sampling clock signal Scks.

At the output of the calculation circuit CAL the digital word signal Sw is provided.

In the depicted example the quantizer circuit Opt is realized by a comparator amplifier which provides at its output exactly one bit with each clock cycle of the main clock signal Sclk. Consequently, the binary result signal Scmp1 is 1 bit wide.

The digital signal Sn in the depicted example has N bits, wherein N is an integer greater than or equal to 1.

Detailed functioning of the current to digital converter circuit is explained with reference to FIG. 3.

Under control of the sampling clock signal Scks the sampling capacitor Cs samples the output voltage Vout. A voltage follower Vf may be inserted between the second switch S2 and the third switch S3. As soon as sampling on the sampling capacitor Cs is completed, said sample is provided to the input of the ADC circuit Ad under control of the conversion clock signal Sckc which closes the third switch S3. The current to digital converter circuit provides a coarse analog-to-digital conversion of the current signal, while the ADC circuit Ad basically provides for a fine analog-to-digital conversion of the current signal. In the depicted example the most significant bit of the digital word signal Sw provided at the output of the calculation circuit CAL is therefore provided by the binary result signal Scmp1. The remaining bits of said digital word signal Sw are provided by the ADC circuit Ad. Thereby clock rates of the sampling clock signal, the conversion clock signal Sckc and the main clock signal Scks may differ from each other. However, the sampling clock signal Scks and the conversion clock signal Sckc are both derived from the main clock signal Sclk.

In another exemplary implementation the sample and hold function realized by the third switch S3 in combination with the sampling capacitor Cs can be realized in a different way as known to those skilled in the art.

Figure 2:
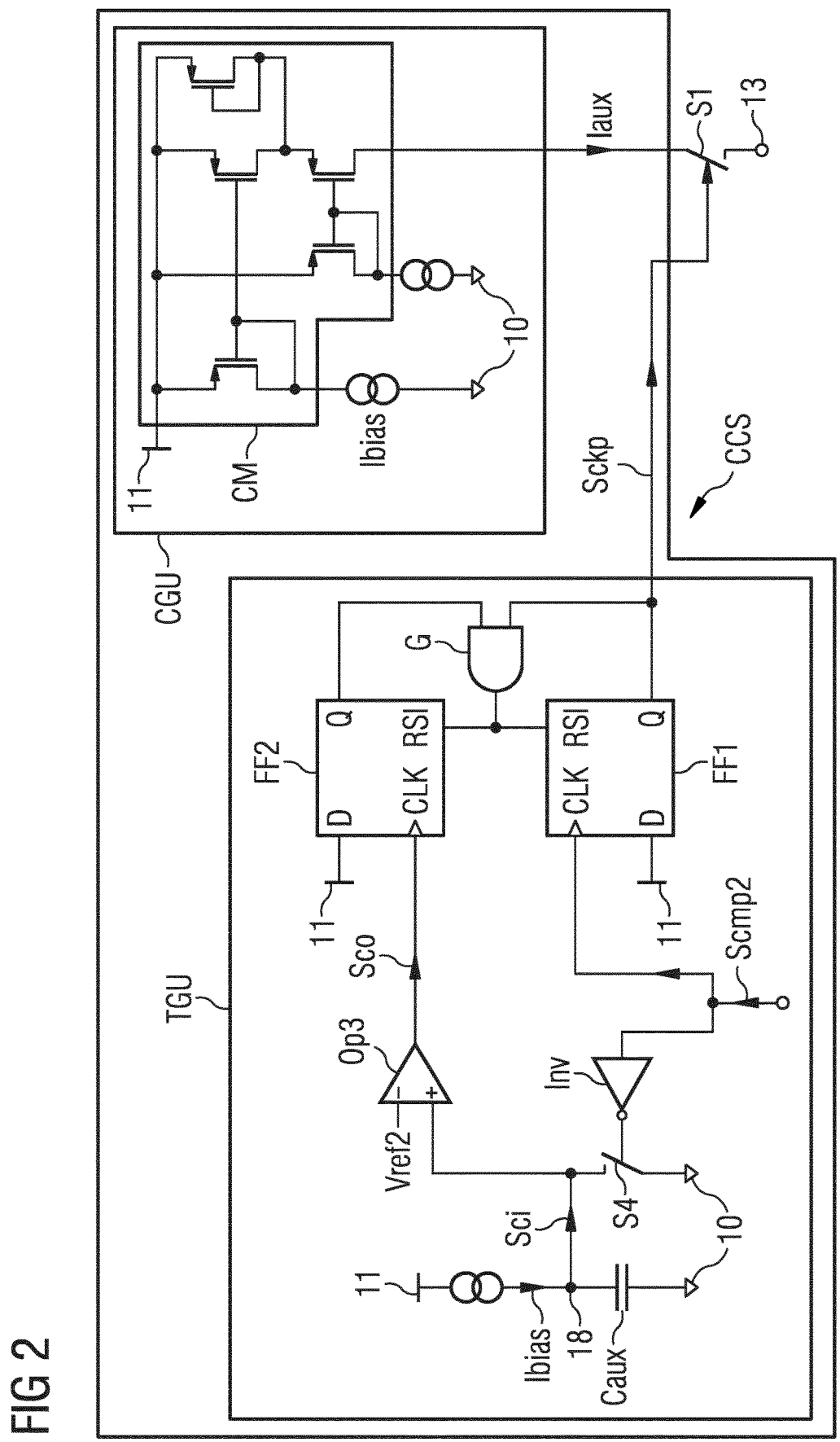
FIG. 2 shows an embodiment example of a controlled current source.

FIG. 2 shows an embodiment example of a controlled current source CCS. FIG. 2 thereby shows an implementation example of the controlled current source CCS as depicted in FIG. 1.

The controlled current source comprises a timing generation unit TGU and a current generation unit CGU. The timing generation unit TGU is prepared to provide the charging clock signal Sckp. In this example the timing generation unit TGU comprises a first and a second flip-flop FF1, FF2, an AND gate G, an inverter Inv, a current source for providing a bias current Ibias and an auxiliary capacitor Caux. The current source for providing the bias current Ibias is coupled between a supply potential terminal 11 and one plate of the auxiliary capacitor Caux.

A second plate of the auxiliary capacitor Caux is coupled to the reference potential terminal 10. A connection point 18 between the current source for providing the bias current Ibias and the auxiliary capacitor Caux is connected to a non-inverting input of the third operational amplifier Op3. The inverting input of the third operational amplifier Op3 receives the second reference voltage Vref2. An output of the third operational amplifier Op3 is connected to a clock input of the second flip-flop FF2. First and second flip-flops FF1, FF2 are both realized as D-flip-flops. The D-input of the second flip-flop FF2 is connected to the supply potential terminal 11. A Q-output of the second flip-flop FF2 is connected to a first input of the AND gate G. A reset input of the second flip-flop FF2 is connected to a reset input of the first flip-flop FF1 and to the output of the AND gate G. A clock input of the first flip-flop FF1 receives the Dac step signal Scmp2. A D-input of the first flip-flop FF1 is connected to the supply potential terminal 11. A Q-output of the first flip-flop FF1 is connected to a second input of the AND gate G.

The Dac step signal Scmp2 is provided to an inverter Inv which controls a fourth switch S4 which provides a switchable connection between the connection point 18 and the reference potential terminal 10. The current generation unit CGU in the depicted example has a current mirror component CM which mirrors the bias current Ibias for providing the auxiliary current Iaux at its output. The current mirror component comprises at least one current mirror. As an alternative, the current generation unit CGU has an adjustable resistor which is connected to the supply potential with one terminal and provides the auxiliary current Iaux. In any of these alternatives, the auxiliary current Iaux is provided to the output of the integrator amplifier whenever the first switch S1 is closed.

A first level change of the charging clock signal Sckp is generated upon occurrence of a level change of the binary result signal Scmp1 which coincides with a level change of the Dac signal Scmp2. A second level change of the charging clock signal Sckp is generated as soon as charging of the auxiliary capacitor Caux by means of the bias current Ibias which is reflected in the charging signal Sci at connection point 18 has reached the level of the second reference voltage Vref2 which is reflected in the end of charge signal Sco. Detailed functioning of the controlled current source is explained with reference to FIG. 4.

Figure 3:
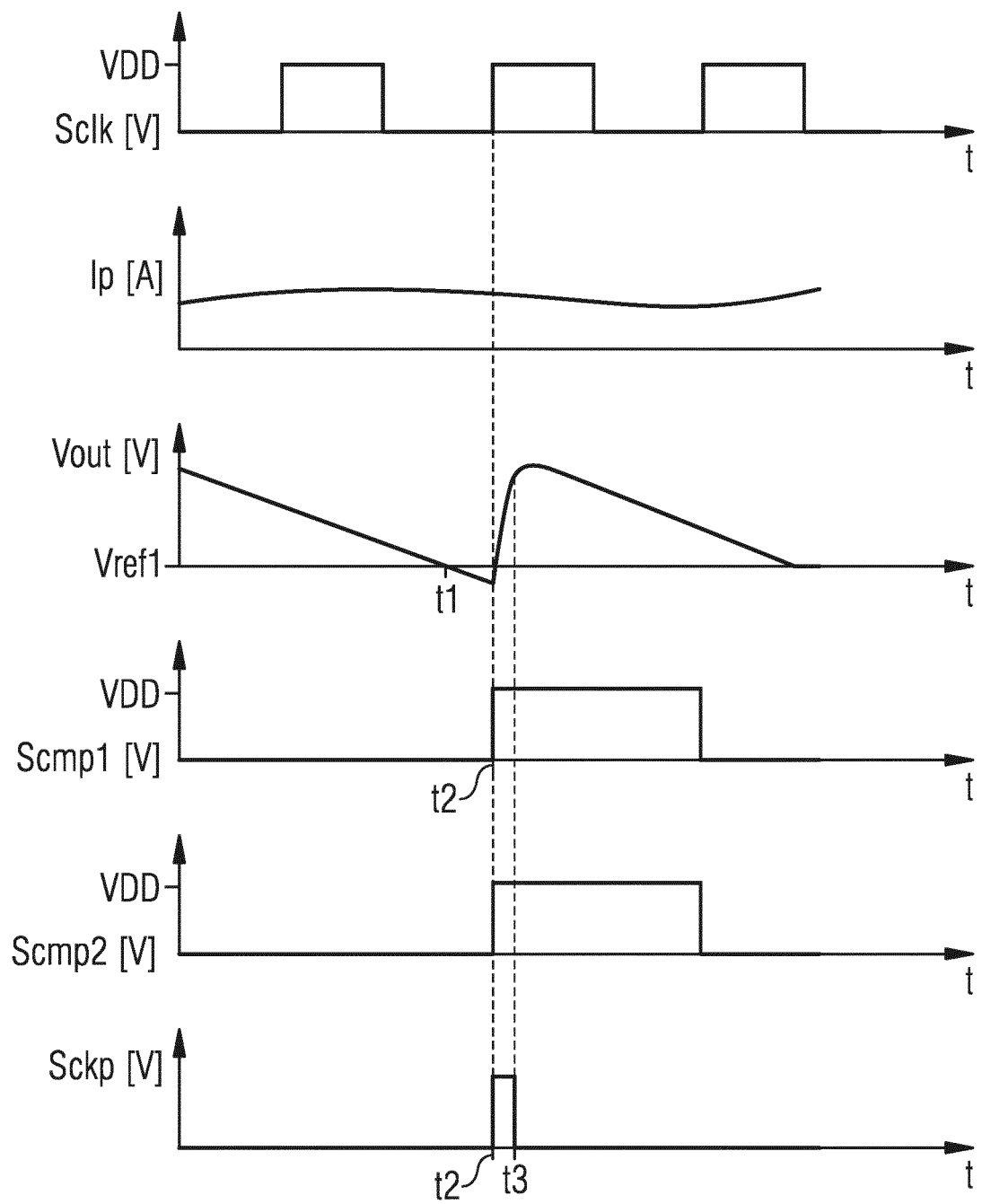
FIG. 3 shows signal diagrams pertaining to the current to digital converter circuit.

FIG. 3 shows signal diagrams pertaining to the current to digital converter circuit as proposed. In each line one signal is depicted in relation to time t. The first line shows the main clock signal Sclk, the second line shows the current signal Ip, the third line shows the voltage signal Vout, the fourth line depicts the binary result signal Scmp1, the fifth line depicts the Dac step signal Scmp2 and the sixth line depicts the charging clock signal Sckp. VDD represents a supply voltage which in the case of a binary signal is the high level, while zero volts are low level.

The current signal Ip is integrated in the integrator amplifier and thereby transformed into the voltage signal Vout. The integration is reflected in a downward ramp in the voltage signal Vout. At the point in time t1 the voltage signal Vout crosses the level of the first reference voltage signal Vref1. With the next impulse of the main clock signal Sclk the output of the quantizer circuit Opt toggles, i.e. changes its level from low to high which is reflected in the binary result signal Scmp1. At point in time t2 the digital-to-analog converter circuit Dac is triggered to inject a charge packet stored on the switched capacitor Cdac which has a polarity opposite to the polarity of the current signal Ip to the input of the integrator amplifier IAmp. Concurrently, at point in time t2 a first level change of the charging clock signal Ckp is generated which in this case is a rising edge. This closes the first switch S1 and causes the auxiliary current Iaux to be provided to the output 13 of the integrator amplifier IAmp. This causes the voltage signal Vout to assume its starting level rapidly. At point in time t3 a second level change of the charging clock signal Sckp is generated, which in this case is a falling edge.

Details of the generation of the falling edge of the charging clock signal Sckp are explained below with reference to FIG. 4.

Figure 4:
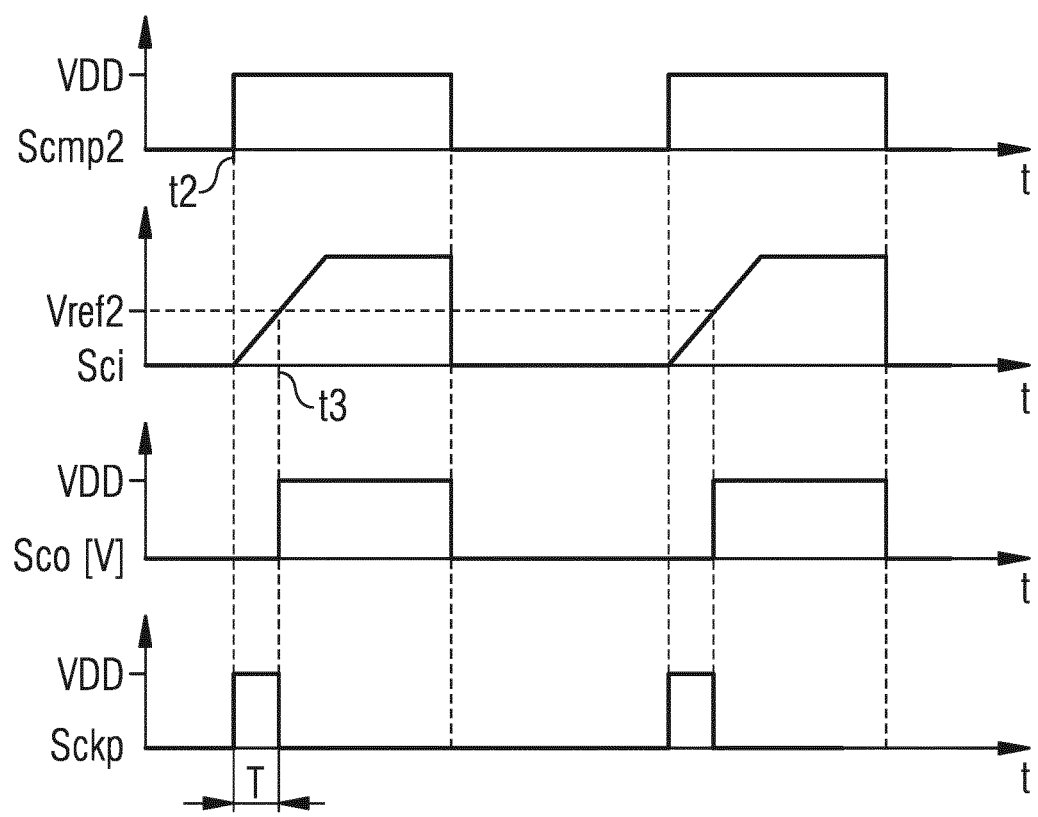
FIG. 4 shows signal diagrams pertaining to the controlled current source of FIG. 2.

FIG. 4 shows signal diagrams which pertain to the controlled current source of FIG. 2. From top to bottom the following signals are depicted in relation to time t: the Dac step signal Scmp2, the charging signal Sci, the end of charge signal Sco and the charging clock signal Sckp. With the rising edge of the Dac step signal Scmp2 at point in time t2, the output of the first flip-flop FF1 goes to 1. By means of the inverter Inv switch S4 is opened and the auxiliary capacitor Caux starts integrating the bias current Ibias as reflected in the charging signal Sci. As soon as the charging signal Sci reaches the value of the second reference voltage Vref2, the output of the third operational amplifier Op3 goes to 1 or high level as reflected in the end of charge signal Sco. This impulse clocks the second flip-flop FF2 such that its Q-output goes to 1. This causes the output of the AND gate to go to 1 as well, thereby resetting the first and the second flip-flops FF1, FF2 via their reset input. This implies the falling edge of the charging signal Sckp at point in time t3.

Consequently the charging clock signal Sckp is high or On for an amount of time t which is the difference between point in time t3 and point in time t2. The On period t can be calculated according to the following equation $$dT = Vref2 * Caux / Ibias \quad (1)$$

wherein dT represents an on period t, Vref2 represents the second reference voltage signal Vref2, Caux represents the capacitance of the auxiliary capacitor Caux and Ibias represents the bias current Ibias.

Thereby, the following amount of charge Qaux is provided with the auxiliary current Iaux to the output 13 of the integrator amplifier IAmp when the first switch S1 is closed.

$$Qaux = Ibias * dT \quad (2)$$

Substituting the first equation (1) with the second equation (2) leads to $$Qaux = Vref2 * Caux$$

It follows that the current to digital converter circuit is insensitive to variations of the bias current Ibias across process and temperature. The voltage step that occurs in the voltage signal Vout at point in time t2 as shown in FIG. 3 can be calculated as follows:

$$Vstep = Vref2 * Cdac / Cfb$$

Therein Cdac represents the capacitance of the switched capacitor Cdac and Cfb represents the capacitance of the feedback capacitor Cfb.

Usually said capacitor ratio is very well controlled, e.g. 0.1% accuracy (6 sigma matching) with reasonable capacitor sizes. This implies that the Vstep changes with the second reference voltage value Vref2 to the first order and is very well controlled. The charge at the output 13 of the integrator amplifier IAmp is calculated according to the following equation:

$$Qout = Vref2 * M * Ccmp$$

wherein M is the mean ratio of the capacitances Cdac and Cfb and Ccmp is the capacitance of the output capacitor Ccmp.

The auxiliary capacitor Caux is realized by the same type as the output capacitor Ccmp which achieves that the process-temperature variation of equations 3 and 5 track each other very well. This implies that the biggest amount of the charge needed by the output of the integrator amplifier IAmp is provided by the controlled current source CCS and therefore the operational amplifier Op1 can be much slower, i.e. implement a larger time constant Tau. Consequently, the whole front end circuit as proposed becomes process and temperature independent to the first order and is only limited by mismatch which can be typically made very small. This effect is explained in more detail with reference to FIGS. 5A and 5B.

Figure 5A:
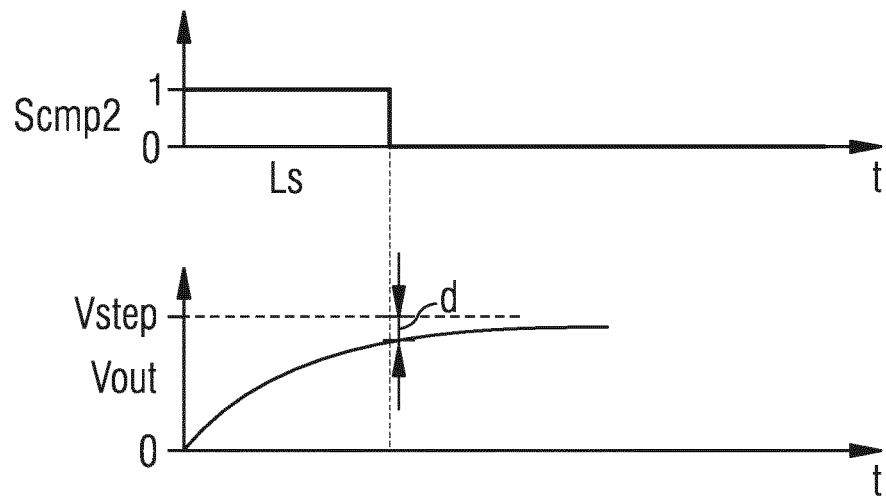
FIGS. 5A and 5B show example signal diagrams.
Figure 5B:
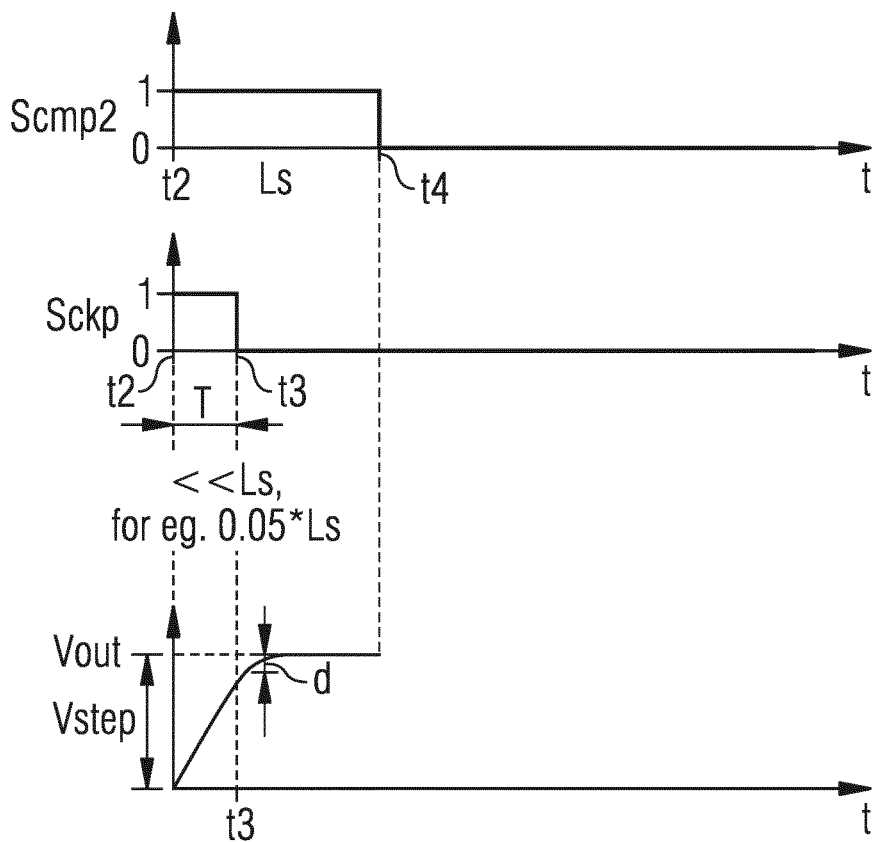

FIGS. 5A and 5B each show the Dac step signal Scmp2 and the voltage signal Vout. In FIG. 5A an implementation of the state of the art is used as a basis which does not have the controlled current source CCS. This means that the voltage signal Vout only slowly recharges to its starting level. The Dac step signal Scmp2 is active for a number of L seconds. It can be seen that the voltage signal Vout has not reached its initial level Vstep at the end of the L seconds. This means that at the end of the cycle of the Dac step signal Scmp2 a relatively high error remains. This is due to the fact that the operational amplifier has to see to the whole settling out of the Dac impulse by itself.

In contrast to this, FIG. 5B is based on the proposed current to digital converter circuit which has the controlled current source to help the integrator amplifier to settle out an impulse of the Dac step signal Scmp2. During the On period of the charging clock signal Sckp the controlled current source CCS provides the auxiliary current Iaux for charging the output of the integrator amplifier IAmp. Consequently, the voltage step at the voltage signal Vout has a higher steepness which leads to a quicker recharge of the output. As can be seen from the graph, the time T is so small, e.g. only 5% of time Ls that 95% of the clock period remain to give the residual charge to output 13. Only a little difference d between the starting level Vstep and the voltage level reached at point in time t3 remains. This difference d is settled by the operational amplifier Op1. It can be seen that enough time remains for this and that at the end of the impulse of the Dac step signal Scmp2 at point in time t4 very low, or even no, error remains.

The second reference voltage Vref2 and the bias current Ibias are adjusted such that the On time t of the charging clock signal Sckp is much smaller than the On time of the Dac step signal Scmp2 between points in time t2 and t4.

Figure 6:
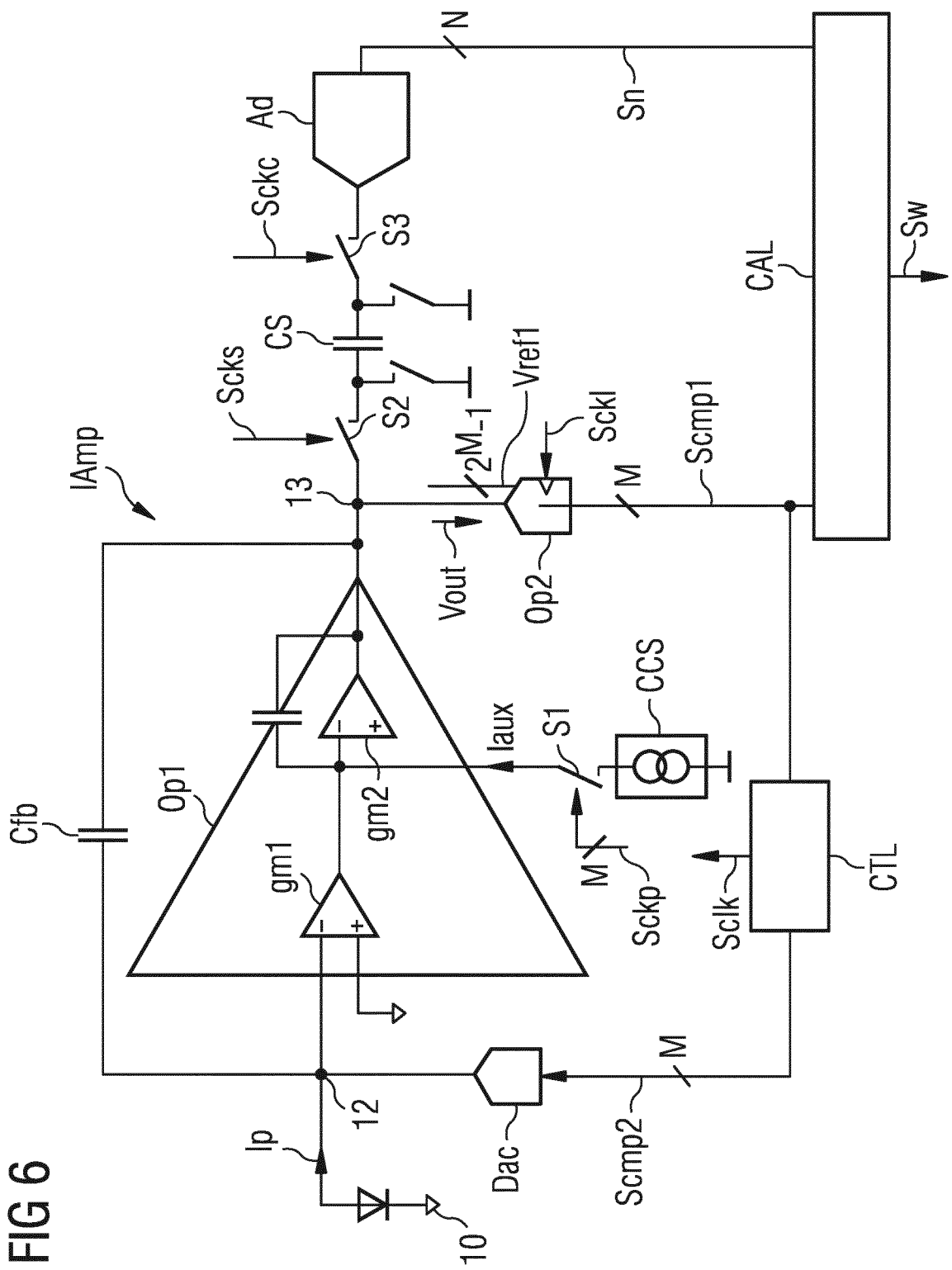
FIG. 6 shows another embodiment example of the optical front end circuit.

FIG. 6 shows another embodiment example of the optical front end circuit as proposed. Basically this embodiment coincides with the embodiment of FIG. 1. In the following only the differences between the embodiment of FIG. 1 and FIG. 6 are explained. In FIG. 6 the quantizer circuit Opt is realized as a clocked quantizer for M bits, wherein M is an integer greater than or equal to 2. The first reference voltage Vref1 is supplied having two to the power of M minus one levels for a flash implementation. Consequently, the binary result signal Scmp1 and the Dac step signal Scmp2 are provided with M bits. The operational amplifier Op1 of the integrator amplifier IAmp is realized with two stages gm1, gm2. Each of the stages gm1, gm2 has one operational amplifier. Therein, an output of the first stage gm1 is provided with the auxiliary current Iaux from the controlled current source CCS via the first switch S1. This helps in faster recharging of the output 13 of the integrator amplifier IAmp. The first switch S1 is controlled by the charging clock signal Sckp which in this case has M bits. The resulting digital word signal Sw has a number of bits corresponding to the sum of M and N.

In another exemplary implementation the clocked quantizer realized by Opt in FIG. 6 can be realized in a different way as known to those skilled in the art.

Figure 7:
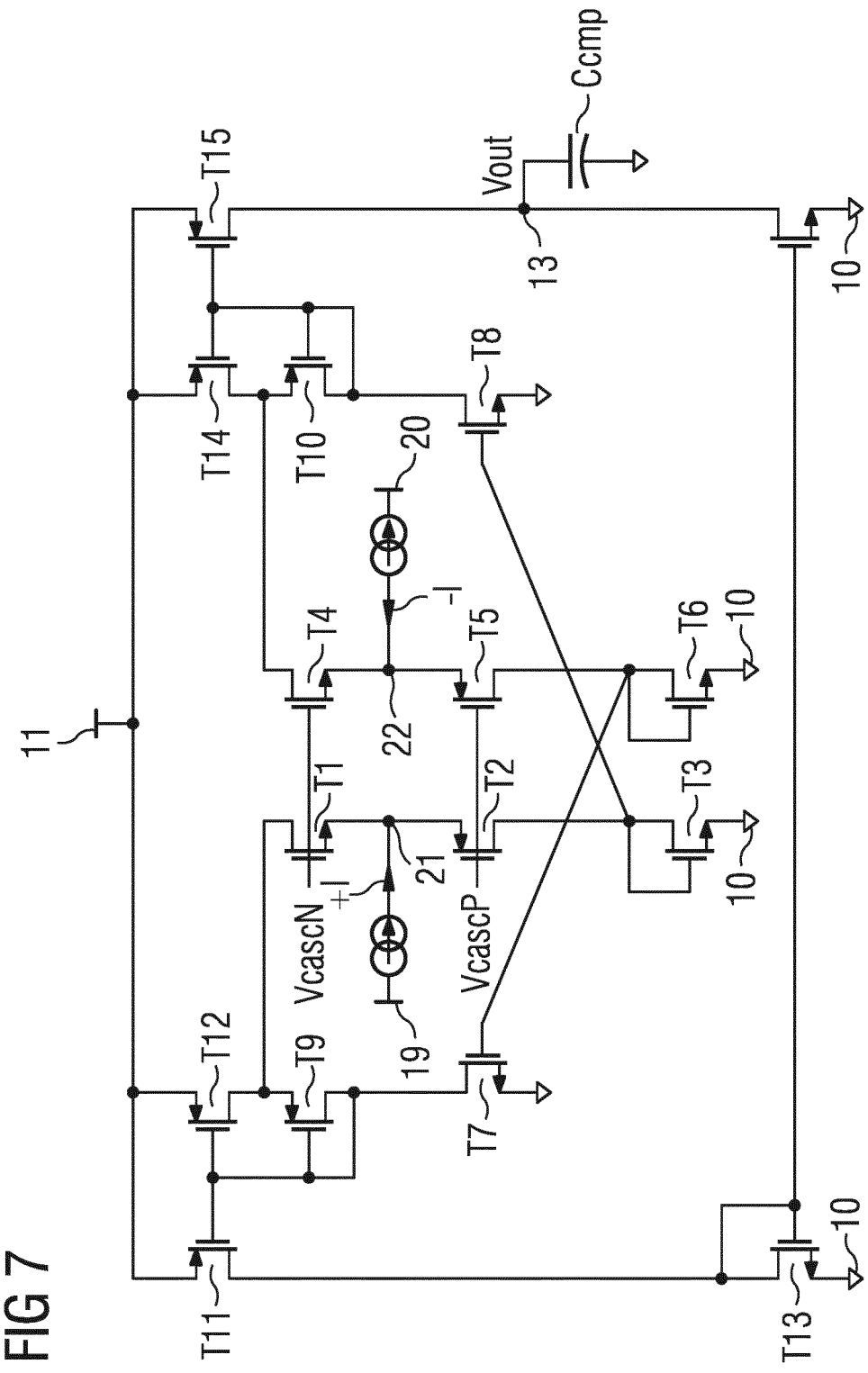
FIG. 7 shows an implementation example for the operational amplifier of the integrator amplifier.

FIG. 7 shows an implementation example for the operational amplifier of the integrator amplifier. Said implementation is to be used with the embodiments depicted in FIG. 1 or FIG. 6 for realizing the operational amplifier Op1. The depicted circuit shows the folded cascode as defined in the claims. The folded cascode comprises transistors T1, T2, T3, T4, T5, T6, T7, T8, T9, T10, T11, T12, T13, T14, T15 and T16. The folded cascode is, on the one hand, connected to the supply potential terminal 11, at which a supply potential for instance Vdd is provided, and on the other hand connected to the reference potential terminal 10, at which a reference potential, for example ground, is provided. In addition to a conventional folded cascode the depicted circuit comprises transistors T9 and T10 each realized as a PMOS transistor, which realizes the folding node. Nodes 21 and 22 represent the drain nodes of the input pair of the operational amplifier Op1. The current source itself represents the input pair which can be seen as converting a voltage into a current. On the left the input pair whose gate is connected to inverting input of the operational amplifier is represented by a current source which supplies the positive current +I. Connection points 19 and 20 represent the common source node of the input pair which is at a ground potential differentially. On the right side the input pair whose gate is connected to non-inverting input terminal of the operational amplifier Op 1 is depicted in the form of a current source providing the negative current −I. Transistors T1 and T2 are connected as cascodes to the drain node 19 of the non-inverting input. Similarly, T4 and T5 are connected as cascodes to the drain terminal 20 of the inverting input. Transistors T6 and T7 are connected as current mirror for the negative current −I. Similarly, transistors T3 and T8 are connected as current mirrors for the positive current +I. The folding node transistor T9 is connected by its source terminal to a drain terminal of transistor T1. A drain terminal of transistor T9 is connected to a drain terminal of transistor T7. A gate terminal of transistor T9 is connected to gate terminals of transistors T11 and T12. The folding node transistor T10, on the right hand side, is connected with its source terminal to the drain terminal of transistor T4. A drain terminal of transistor T10 is connected to a drain terminal of transistor T8. A gate terminal of transistor T10 is connected to the gate terminals of transistors T14 and T15.

A gate terminal of transistor T7 is connected to a gate and a drain terminal of transistor T6. A gate terminal of transistor T8 is connected to a gate and a drain terminal of transistor T3.

Transistor T7 biases transistors T9 and T12, while transistor T8 biases transistors T14 and T10. Therein the current with the same polarity from the other leg is used to bias the folding node, for instance a current crossing transistor T6 which amounts to −I/2 is mirrored to transistor T7 and is used for biasing transistors T9 and T12. In low power and high performance applications it is desirable to bias the input pair at very high bias current and keep the current in the other branches of the operational amplifier low. In FIG. 7 the maximum values of the positive current +I and the negative current −I can be in the order of several hundreds of microampere to milliampere to achieve high performance, whereas the bias currents in the rest of the branches might be a few microampere. However, without using the technique as described above, i.e. biasing the folding nodes of transistors T12 and T9 with transistor T7 whose gate is connected to transistor T6, and biasing the folding nodes transistors 114 and T10 with transistor T8 whose gate is connected to transistor T3, this will generally result in worse slewing/linearity performance for the same power. With the circuit of FIG. 7 low voltage, low power and high performance operation is achieved. The left hand side, for example, needs four times the saturation voltage in transistors T1, T2, T3 and T12 and one threshold voltage for the gate source voltage in transistor T9. In summary, one threshold voltage and four times the saturation voltage are needed for operating the folded cascode as proposed. This saves at least one threshold voltage compared with a state of the art folded cascode. Consequently, headroom constraints can be better met.

On using the proposed folded cascode for realizing the operational amplifier Opa1 of FIG. 1 or FIG. 6, the resulting solution needs at least four times lower power to achieve the same noise and linearity for the optical front end circuit when compared with the state of the art implementations. The proposed solution only needs, for example, 0.9 V from analog ground compared to 1.8 V from analog ground required in conventional solutions. Thereby the solution gets beyond the kT/C limitation.

Furthermore, in the described embodiments, power is saved and a chip area needed for implementations is only about a quarter or less of that of conventional implementations, if the same noise performance is achieved.

Figure 8:
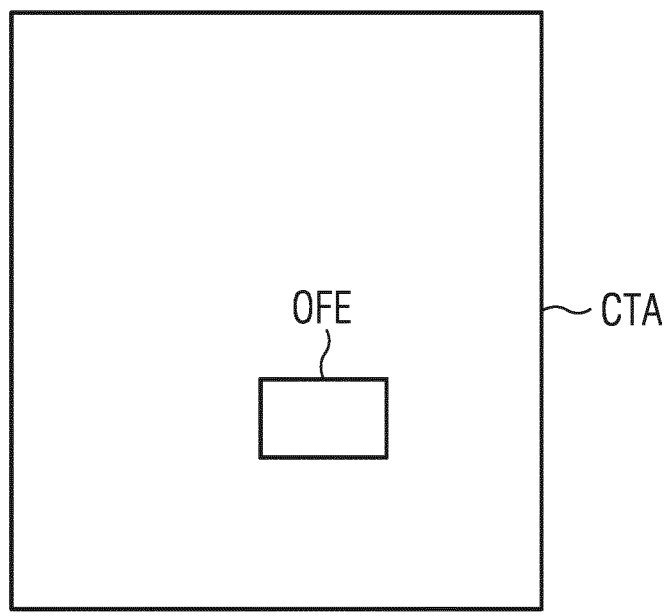
FIG. 8 shows an embodiment example of a computed tomography apparatus.

FIG. 8 shows an embodiment example of a computed tomography apparatus. The computed tomography apparatus CTA comprises an optical front end circuit OFE. The optical front end circuit OFE is implemented in the form of one of the embodiments described above.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the current to digital converter circuit, optical front end circuit, computed tomography apparatus and the method for providing an output voltage as defined in the accompanying claims.

The invention claimed is:

1. A current to digital converter circuit having
an integrator amplifier with an input adapted to receive a current signal and an output adapted to provide a voltage signal as a function of an integration of the current signal,
a quantizer circuit with an input which is coupled to the output of the integrator amplifier and with an output adapted to provide a binary result signal as a function of a comparison of the voltage signal with at least a first reference voltage signal, a digital-to-analog converter circuit which is coupled in a switchable manner as a function of the binary result signal to the input of the integrator amplifier, and a controlled current source which is coupled to the output of the integrator amplifier via a first switch which is controlled as a function of the binary result signal such that an auxiliary current is supplied to the output of the integrator amplifier.

2. The current to digital converter circuit according to claim 1, wherein the auxiliary current is supplied upon occurrence of an impulse of the binary result signal for an amount of time which is smaller than a time constant realized by the integrator amplifier.

3. The current to digital converter circuit according claim 1, wherein the controlled current source comprises a current generation unit and a timing generation unit, wherein the timing generation unit is prepared to provide a charging clock signal, wherein a first level change of the charging clock signal is generated upon occurrence of a level change of the binary result signal and a second level change of the charging clock signal is generated as soon as charging of an auxiliary capacitor comprised by the timing generation unit by means of a bias current has reached a level of a second reference voltage, and wherein the current generation unit is prepared to provide the auxiliary current and comprises either a current mirror component for mirroring the bias current or an adjustable resistor which is connected to a supply potential.

4. The current to digital converter circuit according to claim 1, further comprising a control unit which is prepared to provide a main clock signal for controlling operation of at least the quantizer circuit.

5. The current to digital converter circuit according to claim 1, wherein the integrator amplifier comprises an operational amplifier and an integration capacitor which is coupled in a feedback loop of the operational amplifier between its output and its inverting input, wherein the operational amplifier is realized by a folded cascode wherein each folding node of the folded cascode is implemented by a transistor.

6. The current to digital converter circuit according to claim 5, wherein the operational amplifier is realized by two or more stages.

7. The current to digital converter circuit according to claim 1, wherein the digital-to-analog converter circuit is realized as a one-bit digital-to-analog converter on the basis of a switched capacitor which is additionally connected in a switchable manner to respective terminals for supplying a third reference voltage.

8. The current to digital converter circuit according to claim 1, wherein the digital-to-analog converter circuit is realized as an M bit digital-to-analog converter on the basis of multiple capacitors, wherein M is an integer greater than or equal to two.

9. The current to digital converter circuit according to claim 7, wherein the quantizer circuit is realized as a clocked comparator amplifier for exactly one bit.

10. The current to digital converter circuit according to claim 8, wherein the quantizer circuit is realized as a clocked quantizer for M bit.

11. An optical front end circuit comprising the current to digital converter circuit according to claim 4, wherein the current signal at the input of the integrator amplifier comprises a photocurrent of a photodiode which can be connected to said input, a sampling capacitor which is coupled to the output of the integrator amplifier via a second switch, the second switch being controlled by a sampling clock signal, an analog-to-digital converter, ADC, circuit which is coupled by its input to the sampling capacitor via a third switch, the third switch being controlled by a conversion clock signal, the ADC circuit having an output at which a digital signal is provided, wherein the digital signal is a function of the current signal and comprises N bit, wherein N is an integer greater than or equal to one, and a calculation circuit which is coupled to the output of the ADC circuit and to an output of the quantizer circuit, the calculation circuit being prepared to provide a digital word signal by combining the binary result signal with the digital signal.

12. The optical front end circuit according to claim 11, wherein the control unit is prepared to provide the sampling clock signal and the conversion clock signal both in dependence on the main clock signal, the sampling clock signal and the conversion clock signal having different clock rates or basically equal clock rates.

13. The optical front end circuit according to claim 11, wherein the calculation circuit is prepared to provide the digital word signal as a correlated double-sample.

14. A computed tomography apparatus having an optical front end circuit according to claim 11.

15. A method for providing an output voltage comprising at least the following steps:

supplying a current signal, converting the current signal into a voltage signal by means of charge integration in an integrator amplifier, quantizing the voltage signal and therefrom providing a binary result signal having at least one bit, upon provision of the binary result signal basically concurrently providing an auxiliary current to an output of the integrator amplifier for recharging said output and adding an additional amount of charge in function of the binary result signal to the current signal.

* * * * *